United States Patent
Milkovich et al.

[11] Patent Number: 6,100,114
[45] Date of Patent: Aug. 8, 2000

[54] ENCAPSULATION OF SOLDER BUMPS AND SOLDER CONNECTIONS

[75] Inventors: Cynthia S. Milkovich; Mark V. Pierson, both of Vestal; Son K. Tran, Endwell, all of N.Y.

[73] Assignee: International Business Machines Corporation, Armonk, N.Y.

[21] Appl. No.: 09/132,127

[22] Filed: Aug. 10, 1998

[51] Int. Cl.[7] .......................... H01L 21/44; H01L 21/48; H01L 21/50

[52] U.S. Cl. .......................... 438/127; 438/106; 438/126

[58] Field of Search .................................. 438/127, 126, 438/106

[56] References Cited

U.S. PATENT DOCUMENTS

| | | | |
|---|---|---|---|
| 5,363,277 | 11/1994 | Tanaka | 361/760 |
| 5,661,088 | 8/1997 | Tessier et al. | 29/841 |
| 5,663,106 | 9/1997 | Karavakis et al. | 438/127 |
| 5,704,116 | 1/1998 | Gamota et al. | 29/840 |
| 5,714,252 | 2/1998 | Hogerton et al. | 428/344 |
| 5,776,796 | 7/1998 | Distefano et al. | |

OTHER PUBLICATIONS

L. P. McGovern et al. "High–Throughput, Low–Cost Flip Chip–On–Board Assembly" Electronic Packaging & Production, Feb. 1998, pp. 68–76.

D. Gamota & C. Melton, "Materials to Integrate the Solder Reflow and . . . " IEEE Trans. on CPMT, Part C, vol. 21, No. 1, Jan. 1998, pp. 57–65.

"A High Speed Underfill Development for Flip Chips," SMT MAgazine, Feb. 1998, pp. 46 and 48.

*Primary Examiner*—Kevin M. Picardat
*Assistant Examiner*—D. M. Collins
*Attorney, Agent, or Firm*—John R. Pivnichny

[57] ABSTRACT

Solder bumps on electronic components are encapsulated before attachment to a substrate or component carrier. A film of sealing material is pressed against top portions of the solder bumps by pressing with a layer of low durometer flexible material. Encapsulant is positioned between the component and the film and in contact with the bumps, and partially cured. The film and layer of flexible material are removed to expose the top portions of the encapsulated solder bumps.

14 Claims, 5 Drawing Sheets

6,100,114

ENCAPSULATION OF SOLDER BUMPS AND SOLDER CONNECTIONS

TECHNICAL FIELD

The invention relates to encapsulation of solder connections of electronic components and in particular to encapsulation of solder bumps and balls on semiconductor chips, discrete components, and chip carriers. The invention also relates to encapsulation of solder connections between the above components and a circuitized substrate.

BACKGROUND OF THE INVENTION

Electronic components are frequently designed and build with a group of solder bumps or balls as the electrical contacts to be interconnected to a substrate or other components. Such an arrangement is advantageous for providing a relatively large number of connections in a small area which can be simultaneously joined in one solder reflow operation. One example of such an arrangement at the semiconductor level is the flip chip and controlled collapse chip connection (hereinafter referred to as "C4") as described in Seraphim, Lasky, and Li, "Principles of Electronic Packaging", McGraw Hill, 1989 pages 595–598 which is incorporated herein by reference. Another example at the chip carrier level is the ball grid array package such as is described in U.S. Pat. No. 5,572,405 by Wilson et al.

Various encapsulant materials have been developed and used to surround the individual solder connections after the electronic component is joined to a substrate or another component. The purpose of the encapsulant may be to protect the solder from exposure to detrimental environmental conditions such as moisture, dust, or corrosive atmospheres or even the oxygen in the surrounding air. Another purpose of the encapsulant, well known in the art is to strengthen the solder joints in order to make these more resistant to stresses and in particular to stresses caused by differing thermal expansion coefficients between the component and substrates which are interconnected by the solder joints.

The encapsulant can be applied as a liquid after the solder joints are formed by dispensing the encapsulant through a nozzle or needle in the region about the periphery of the joints. After dispensing, the liquid flows into the space between the component and substrate and around the connections by capillary action. This is a slow process and subject to defects caused by entrapped air packets, debris, or contamination from the solder joining e.g. reflow process. The encapsulant is typically cured by heating for 1–2 hours at about 130°–160° C. Dispensing and curing of an encapsulant is well known and described in many documents such as U.S. Pat. No. 5,661,088 by Tessier et al.

It is also possible to place a quantity of encapsulant material onto a substrate prior to component attach. For example, a flip chip is then placed on the substrate with solder bumps down to compress and pierce the encapsulant to form a compression bond to the substrate. The solder bumps are then reflowed to make solder connection to the substrate while simultaneously curing the encapsulant as described by McGovern et al. in Electronic Packaging & Production, February 1998 pp. 68–76.

A flip chip may also be electrically connected to a substrate by bonding the two together with an adhesive material initially provided in either a liquid or sheet form as described in U.S. Pat. No. 5,714,352 by Hogerton et al and also earlier by Tanaka in U.S. Pat. No. 5,363,277. Bonding elements on the flip chip are forced into contact with corresponding pads on a substrate and held in place by the adhesive without forming solder joints. If the adhesive is provided in sheet form, the bonding elements are forced through the sheet. It is important that the substrate be deformable so that a "wiping action" occurs between the chip bonding elements and the pads when the bonding elements are forced into contact with the pads. In addition the deformation accommodates variation in height of the bonding elements. Because the bonding element and pad eventually penetrate into the surface of the substrate a predetermined distance, this invention is limited to use on deformable substrates.

In the foregoing encapsulation methods, the encapsulant material is applied to the substrate either before or after a component with solder bumps is attached. It would be advantageous, however, to apply the encapsulant to the component prior to attachment thereby permitting the apply procedure to be performed by a component supplier as part of the component manufacturing process. U.S. patent application Ser. No. 08/939,302 filed Sep. 19, 1997 U.S. Pat. No. 5,888,850 and assigned to the same assignee uses an imersion process with components. In the case of flip chips, for example, applying the encapsulant while the chips are still in wafer form prior to dicing could lead to batch processing and the resulting economics of scale.

Substrates, especially circuit boards, supporting a plurality of components frequently have components of many differing sizes and shapes, often requiring a variety of encapsulation quantities and procedures. Having the encapsulation material already applied to a component prior to attachment to a substrate eliminates or reduces the need to accommodate and provide for this variety and is a desirable capability.

Therefore, in accordance with the teachings of the present invention, there is provided an encapsulation method which can be applied to electronic components. It is believed that such a method constitutes a significant advancement in the art.

OBJECTS AND SUMMARY OF THE INVENTION

It is a principal object of the present invention to enhance the art of electronic component solder connection encapsulation by providing a method of encapsulating solder bumps.

It is another object to provide a method of applying encapsulating material to an electronic component having solder bumps.

It is yet another object to provide a method of applying encapsulation material to a semiconductor chip having solder bumps while the chip is in wafer form.

It is a further object of the invention to provide a method of encapsulating solder connections between a semiconductor chip and a circuitized substrate.

These and other objects are attained in accordance with one embodiment of the invention wherein there is provided a method of at least partially encapsulating a plurality of solder bumps which comprises the steps of providing an electronic component having a plurality of solder bumps each including a top portion, positioning a film of sealing material adjacent the bumps, positioning a layer of a low durometer flexible material adjacent the film of sealing material and pressing the laser of flexible material and the film of sealing material to cause the film of sealing material to contact the top portions of the solder bumps,, positioning an encapsulant material substantially between the electronic component and the film of sealing material and in contact with the solder bumps, partially curing the encapsulant material, and removing the layer of low durometer flexible material and the film of sealing material to expose the top portions of the solder bumps.

In accordance with another embodiment of the invention there is provided a method of at least partially encapsulating a plurality of solder connections which comprises the steps of providing a semiconductor chip having a plurality of solder bumps each including a top portion, positioning a film of sealing material adjacent the bumps, positioning a layer of a low durometer flexible material adjacent the film of sealing material and pressing the layer of flexible material and the film of sealing material to cause the film of sealing material to contact the top portions of the solder bumps, positioning an encapsulant material substantially between the semiconductor chip and the film of sealing material and in contact with the solder bumps, partially curing the encapsulant material, removing the layer of low durometer flexible material and the film of sealing material to expose the top portions of the solder bumps, providing a circuitized substrate, and subsequently bringing the top portions of the solder bumps into contact with the circuitized substrate and heating the solder bumps and the encapsulant material to encapsulate solder connections between the semiconductor chip and the circuitized substrate.

BEST MODE FOR CARRYING OUT THE INVENTION

For a better understanding of the present invention, together with other and further objects, advantages and capabilities thereof, reference is made to the following disclosure and the appended claims in connection with the above described drawings.

Figure 1:
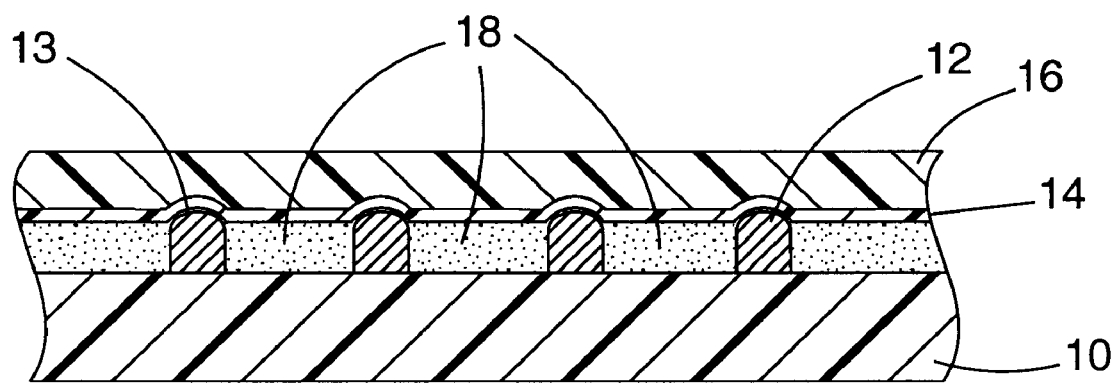
FIG. 1 illustrates in cross section a film of sealing material pressed against solder bumps on an electronic component by pressing a low durometer flexible material against it. An encapsulant material is positioned between the film and component.

In FIG. 1 there is shown an electronic component 10 having solder bumps 12 with tops 13. The component can be a semiconductor chip having solder bumps known as a flip-chip or C4-chip. It can also be any other type of component such as a passive component or integrated circuit having protruding solder contacts. The solder bumps may be of any material known in the art as a solder and can be of various protruding shapes including conical, spherical, pointed, hemispherical, rounded, or broad and flat. A film of sealing material 14 may be a high temperature polyimide such as Kapton™ (a chemically cured polyimide available from E.I. DuPont De Nemours & Co.) or Teflon™ (a polytetrafluoroethylene composition) or any other material which is able to withstand the curing temperature of an encapsulant described below, or a combination of these is positioned on the bumps 12. A low durometer, preferably 40–50 durometer, layer of flexible material 16 is placed adjacent the film 14. A durometer is herein defined to be consistent with the usage in "An Analysis of the "Durometer" Indentation," by Briscoe an Sebastian, Rubber Chemistry and Technology vol. 66, no.5, 1993, pp. 827–836. The flexible material may be a silicone material such as GE silicon type 3281 available from General Electric Company of Waterford, N.Y. or Dow silicone type 1-4731 available from Dow Corning Corporation in Midland, Mich., preferably in sheet form. By pressing against the flexible material 16 the film 14 is forced against the tops 13 of the bumps 12 forming a seal over the bumps. The flexibility of material 16 accommodates variations in the height and shape of the bumps to insure a good seal between the top of each bump and the film.

An encapsulant material 18 preferably a thermoplastic adhesive such as type 397 Acrylic/Urethane available from Loctite Corp. of Rocky Hill, Conn. is then inserted between the component 10 and film 14. The seal described above prevents the encapsulant from contacting the tops of the bumps. The encapsulant is preferably inserted in liquid form by injecting which may be assisted through use of a vacuum atmosphere.

The encapsulant is then partially cured which may be accomplished by applying heat, ultraviolet energy, or any other curing technique known in the art. The layer of flexible material and film are then removed, for example by peeling away, to expose the top portions of the solder bumps.

Figure 2:
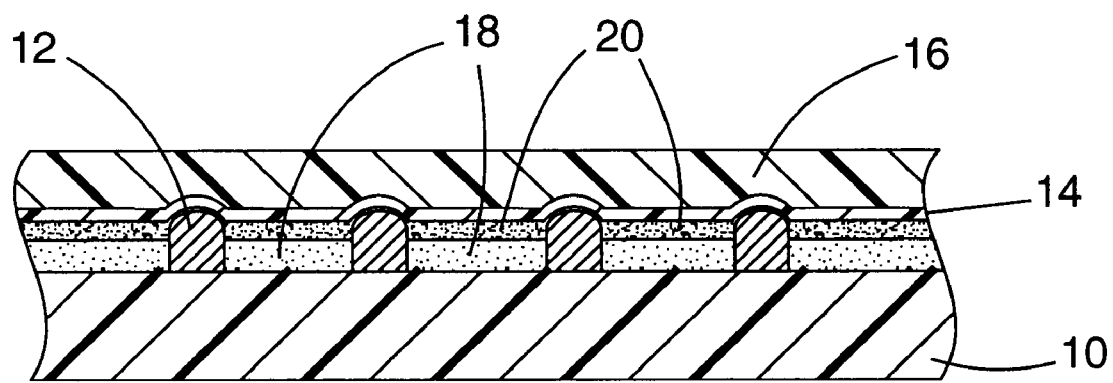
FIG. 2 illustrates adding a thermoplastic adhesive between the encapsulant and film.

In FIG. 2 there is shown another embodiment of the present invention wherein a thermoset encapsulant material 18 such as type FP4526 available from Dexter Corporation, City of Industry, Calif. is inserted between the component and the film and in contact with the solder bumps. After inserting encapsulant material 18 and partial curing, the film is retracted for example by a reduction of the pressing upon the flexible material. The retracting is slight enough to still maintain some contact between the film and the tops of the solder bumps. A thermoplastic adhesive material 20 is then injected between the encapsulant material 18 and the film 14. The thermoplastic adhesive material is preferably type 397 Acrylic/Urethane available from Loctite Corp. of Rocky Hill, Conn. however, any thermoplastic adhesive known in the art may be used.

Figure 3:
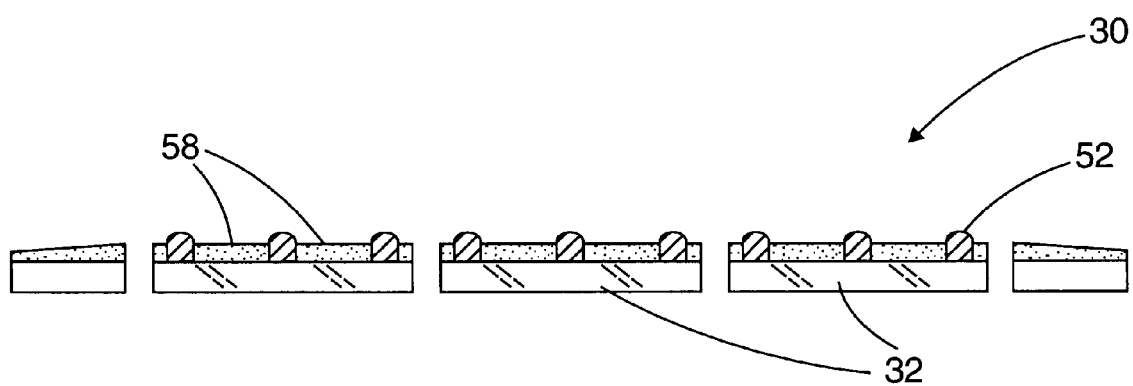
FIG. 3 shows semiconductor chips with solder bumps and encapsulant applied in wafer form, then diced into individual chips.

In FIG. 3 a wafer 30 of semiconductor chips 32 having solder bumps 52 encapsulated with encapsulant material 58 is shown. The chips 32 are shown diced apart after encapsulant material 58 is partially cured. Encapsulating solder bumps of chips while in wafer form is particularly advantageous because of the economics involved in processing a large number of chips simultaneously, even though some of the chips will be discarded due to the yield of semiconductor processing steps.

The method of the present invention, however, is not limited to processing chips in wafer form and may also be applied to encapsulating solder bumps on individual chips as shown in FIGS. 1 and 2.

Figure 4:
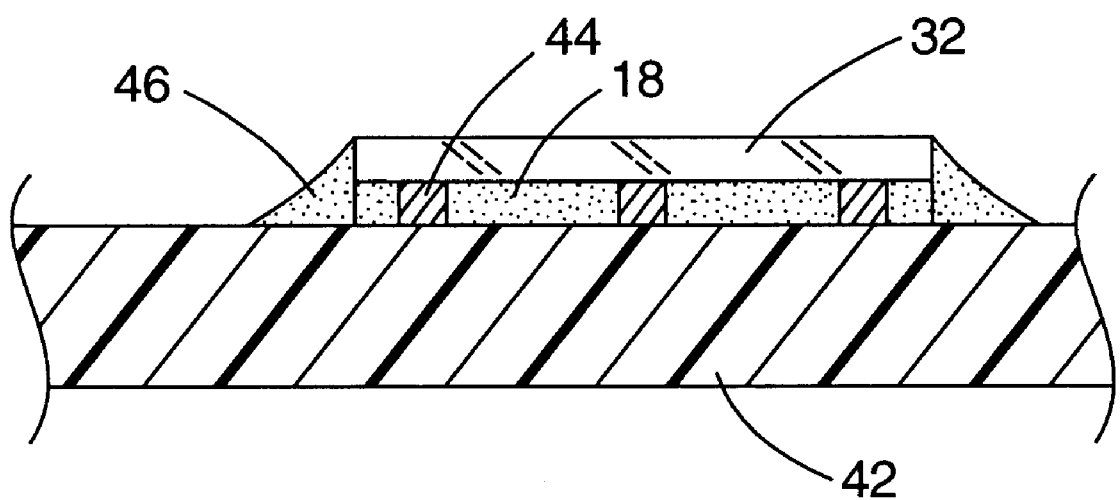
FIG. 4 illustrates encapsulated solder joints between a component and substrate according to the present invention. An edge sealant has been added.
Figure 5:
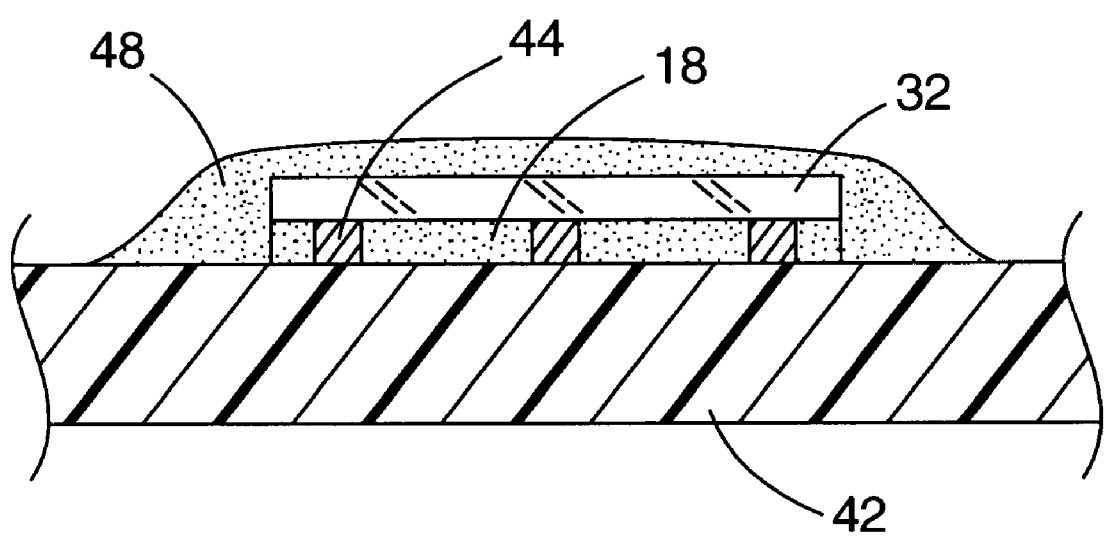
FIG. 5 also shows encapsulated solder joints but with an overmold added.

After a semiconductor chip 32 is joined to a substrate 42 by reflowing solder bumps to form encapsulated solder connections 44 as shown in FIGS. 4 and 5, an additional sealant may optionally be added. In FIG. 4 an edge sealant 46 is added and in FIG. 5 an overmold material 48 is applied. A preferred edge sealant material is Hysol FP4450; and a preferred overmold material is also Hysol FP4450 available from the Dexter Corp. (Hysol is a trademark of the Dexter Corp.)

Thus there has been shown and described a method of encapsulating solder bumps 12 of an electronic component in relatively facile manner. The electronic component may then be bonded to a substrate or another component by reflowing the solder bumps to form encapsulated solder connections. The invention is thus deemed to constitute a significant advancement in the art.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of at least partially encapsulating a plurality of solder bumps on a semiconductor chip, comprising the steps of:

provideng a semiconductor chip having a plurality of solder bumps, each including a top portion;

positioning a film of sealing material adjacent said bumps;

positioning a layer of a low durometer flexible material adjacent said film of sealing material;

pressing said layer of flexible material and said film of sealing material to cause said film of sealing material to contact said top portions of said solder bumps;

positioning an encapsulant material substantially between said semiconductor chip and said film of sealing material and in contact with said solder bumps;

at least partially curing said encapsulant material; and removing said layer of low durometer flexible material and said film of sealing material to expose said top portions of said solder bumps.

2. The method of claim 1, wherein said semiconductor chip is provided as a semiconductor chip in wafer form.

3. The method of claim 1 wherein said pressing said film of sealing material further comprises pressing a sheet of Kapton or Teflon.

4. The method of claim 1 wherein said positioning said layer of flexible material further comprises positioning a silicone layer.

5. The method of claim 1 wherein said encapsulant material is positioned substantially between said semiconductor chip and said film, in liquid form.

6. The method of claim 5 wherein said encapsulant material is positioned substantially by injection.

7. The method of claim 6, further comprising applying a vacuum between said semiconductor chip and said film of sealing material during said injection of said encapsulant material.

8. The method of claim 1 wherein said at least partial curing of said encapsulant material is accomplished by heating.

9. The method of claim 1 further comprising retracting said film of sealing material after said at least partially curing of said encapsulant material while maintaining said contact with said top portions of said solder bumps and injecting a thermoplastic adhesive material between said encapsulant material and said film of sealing material.

10. The method of claim 1 wherein said film of sealing material is removed by peeling.

11. A method of at least partially encapsulating a plurality of solder connections, comprising the steps of:

providing a semiconductor chip having a plurality of solder bumps each including a top portion;

positioning a film of sealing material adjacent said bumps;

positioning a layer of a low durometer flexible material adjacent said film of sealing material;

pressing said layer of flexible material and said film of sealing material to cause said film of sealing material to contact said top portions of said solder bumps;

positioning an encapsulant material substantially between said semiconductor chip and said film of sealing material and in contact with said solder bumps;

at least partially curing said encapsulant material;

removing said layer of low durometer flexible material and said film of sealing material to expose said top portions of said solder bumps;

providing a circuitized substrate; and subsequently, bringing said top portions of said solder bumps into contact with said circuitized substrate and heating said solder bumps and said encapsulant material to encapsulate solder connections between said semiconductor chip and said circuitized substrate.

12. The method of claim 11 wherein said semiconductor chip is provided having solder bumps which are substantially spherical.

13. The method of claim 11 further comprising applying an edge sealant material adjacent the perimeter of said semiconductor chip.

14. The method of claim 11 further comprising applying an overmold material adjacent said semiconductor chip.

* * * * *